United States Patent [19]

Yamada et al.

[11] Patent Number: 5,178,977
[45] Date of Patent: Jan. 12, 1993

[54] MANUFACTURING METHOD OF AN X-RAY EXPOSURE MASK

[75] Inventors: Masao Yamada, Yokohama; Kazuaki Kondo, Sagamihara, both of Japan

[73] Assignee: Fujitsu Limited, Kawasaki, Japan

[21] Appl. No.: 466,939

[22] Filed: Jan. 18, 1990

[30] Foreign Application Priority Data

Jan. 18, 1989 [JP] Japan .................................. 1-7751

[51] Int. Cl.5 ................................................ G03F 9/00
[52] U.S. Cl. ........................................... 430/5; 378/35
[58] Field of Search ............................... 430/5; 378/35

[56] References Cited

U.S. PATENT DOCUMENTS

| | | | |
|---|---|---|---|
| 3,873,824 | 3/1975 | Bean et al. | 378/35 |
| 4,253,029 | 2/1981 | Lepselter et al. | 250/505 |
| 4,608,326 | 8/1986 | Neukermans et al. | 430/5 |
| 4,941,942 | 7/1990 | Bruns et al. | 156/657 |
| 4,971,851 | 11/1990 | Neukermans et al. | 428/137 |
| 5,005,075 | 4/1991 | Kobayashi et al. | 430/5 |

FOREIGN PATENT DOCUMENTS 20767 7/1978 Japan .
1-02927 3/1989 Japan .

OTHER PUBLICATIONS

Luethje et al. describes a technological background of the X-ray exposure mask fabrication together with possibility of using SiC for the mask. "Stability of SiC--Mask . . . ", Microelectronics Eng. 5 (1986) 39.

Primary Examiner—Charles L. Bowers, Jr.
Assistant Examiner—Thomas R. Neville
Attorney, Agent, or Firm—Staas & Halsey

[57] ABSTRACT

A method of manufacturing an X-ray exposure mask comprises steps of forming a membrane including a layer of crystalline silicon carbide on a silicon substrate, processing a top surface of the membrane such that the top surface becomes a mirror-flat top surface, depositing a layer of X-ray absorbing material on the mirror-flat top surface of the membrane, and patterning the layer of the X-ray absorbing material according to a desired semiconductor pattern.

8 Claims, 8 Drawing Sheets

MANUFACTURING METHOD OF AN X-RAY EXPOSURE MASK

BACKGROUND OF THE INVENTION

The present invention generally relates to masks used for X-ray beam lithography and more particularly to a membrane used in the X-ray exposure mask or in a reticle for supporting a layer of X-ray absorbing material patterned according to a desired semiconductor device.

Generally, the membrane used in the X-ray exposure mask is required to have a high Young modulus, high tensile strength, high optical transparency, excellent resistance against radiation, and smooth surface. Currently, silicon carbide (SiC) is regarded as one of the most promising materials satisfying these requirements. Note that SiC has a Young modulus of $3-4 \times 10^{12}$ dyn/cm$^2$ and a resistance against radiation of about 100 MJ/cm$^3$ which are superior than other candidate materials such as boron nitride (BN), BNC, or silicon nitride (Si$_3$N$_4$). Therefore, there is a need of a technique to manufacture the X-ray lithography mask using the SiC membrane.

The SiC membrane is usually formed by depositing SiC on a substrate by high temperature chemical vapor deposition (CVD) undertaken at a temperature in the range of 700° C. to 1380° C. The SiC membrane thus formed usually is made of a single crystal or polycrystal of SiC and is more stable against radiation than the amorphous SiC which is formed under a lower temperature condition by plasma CVD or ECR (electronic cyclotron resonance) processes although the latter has an excellent mirror surface associated with its amorphous structure.

The membrane of the crystalline SiC suitable for the X-ray exposure mask is typically deposited on a single crystal silicon (Si) substrate for a thickness of 2-3 μm. Such a thick layer of SiC deposited on Si, however, has a problem in that formation of steps of about 0.1 μm to 0.2 μm on its surface is inevitable due to the mismatching of thermal expansion between Si and SiC or due to the grain boundaries appearing on the surface. Thus, the crystalline SiC membrane formed by the high temperature CVD process does not possess a completely defect-free mirror surface in the state that the membrane is formed.

In the X-ray exposure mask, a layer of material absorbing the X-ray such as tantalum (Ta) or gold (Au) is deposited on the SiC membrane and patterned as desired by selective etching. As the desired line width of the patterns in such an X-ray exposure mask is about 0.1 μm to 0.2 μm, the existence of surface irregularities having the magnitude about equal to this line width in the membrane is harmful as will be easily understood. Such irregularities are transferred on the semiconductor and decreases the yield of the manufactured semiconductor device.

Further, the applicants found that there exists a more serious problem in the conventional X-ray exposure mask of which reason is not understood at the moment. More specifically, when Ta is deposited on the SiC membrane as the material for absorbing the X-ray and thereafter patterned, it was found that Ta remains unetched particularly on the projected part of the irregular surface of the SiC membrane even after the patterning. On the contrary, Ta does not remain in the depressed part of the membrane surface, contrary to the commonly understood behavior. Thus, Ta remains on the surface of the SiC membrane where it should not exist. Such a membrane cannot be used for patterning the semiconductor devices.

Conventionally, there has been a number of efforts to grow the SiC membrane such that it has a mirror-flat top surface by controlling the condition of crystal growth. The term "mirror-flat" herein means a flat and smooth surface in which the step height of surface depressions or projections is less than at least 0.1 μm or below the detection limit. However, such an approach has been so far not successful or effective.

SUMMARY OF THE INVENTION

Accordingly, it is a general object of the present invention to provide a novel and useful method of manufacturing an X-ray exposure mask wherein the aforementioned problems are eliminated.

Another and more specific object of the present invention is to provide a method of manufacturing an X-ray exposure mask comprising a step of forming a mirror-flat top surface on a SiC membrane supporting an X-ray absorbing material layer.

Another object of the present invention is to provide a method of manufacturing an X-ray exposure mask comprising a step of growing a crystalline SiC membrane and preparing the surface of the SiC membrane such that the membrane has a mirror-flat top surface, before depositing a layer of X-ray absorbing material on the mirror-flat top surface.

Another object of the present invention is to provide a method of manufacturing an X-ray exposure mask comprising steps of growing a crystalline SiC membrane on a substrate, preparing the top surface of the SiC membrane such that the top surface becomes a mirror-flat surface, and providing a mask pattern of an X-ray absorbing material on the mirror-flat top surface of the membrane.

Another object of the present invention is to provide a method of manufacturing an X-ray exposure mask comprising steps of growing a crystalline SiC membrane on a substrate, growing a material layer on said SiC membrane such that the material layer has a mirror-flat surface, and providing a mask pattern of an X-ray absorbing material on the mirror-flat top surface of the material layer.

Another object of the present invention is to provide a method of manufacturing an X-ray exposure mask comprising steps of growing a crystalline SiC membrane on a substrate, growing a material layer on the SiC membrane such that the material layer has a mirror-flat top surface, removing a surface of the material layer while maintaining the mirror-flat top surface, and providing a mask pattern of an X-ray absorbing material on the mirror-flat top surface of the amorphous carbon layer.

According to any of the foregoing methods, the mask pattern is provided on the mirror-flat top surface of the crystalline SiC membrane and the irregularities of the pattern due to the irregular surface of the SiC membrane is entirely eliminated. At the same time, the problem of unetched X-ray absorbing material remaining in the portion other than the pattern on the membrane such as the depressed portion is entirely eliminated. As the SiC membrane is formed from crystalline SiC, the resistance of the membrane to the radiation is excellent. Further, the crystalline SiC membrane thus formed has a high Young modulus and high tensile strength. Furthermore, by covering the surface of the SiC membrane by the glass layer and removing the glass layer by etching, any contamination on the surface of the glass layer caused by handling during various processes of manufacturing is entirely lifted off and the surface on which the mask pattern is to be provided is maintained clean.

Other objects and further features of the present invention will become apparent from the following detailed description when read in conjunction with attached drawings.

DETAILED DESCRIPTION

FIGS. 1(A)-(F) shows a first embodiment of the present invention.

Figure 1A:
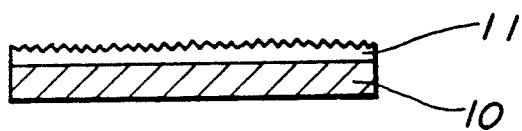
FIGS. 1(A)-(F) are diagrams showing a manufacturing process of the X-ray exposure mask according to an embodiment of the present invention.

Referring to FIG. 1(A), a SiC membrane layer 11 is grown on a Si substrate by a CVD process undertaken at a temperature in the range of 700°C.–1000° C. for a thickness of about 2 $\mu$m. Such a growth of the SiC layer 11 may be achieved by using an induction heated so-called cold wall type CVD apparatus or a lamp heated so-called hot wall type CVD apparatus while supplying a source gas which may be a mixture of trichlorosilane (SiHCl$_3$) or dichlorosilane (SiH$_2$Cl$_2$) and propane (C$_3$H$_8$) or acetylene (C$_2$H$_2$), together with hydrogen (H$_2$) as a dilution gas. The SiC membrane layer 11 thus grown is made of a polycrystalline _-phase SiC with a grain size of about 0.2 $\mu$m. In correspondence to the polycrystalline texture, the surface of the layer 11 becomes irregular with a surface roughness of about 0.2 $\mu$m which is approximately the same as the size of the grains.

Figure 1B:
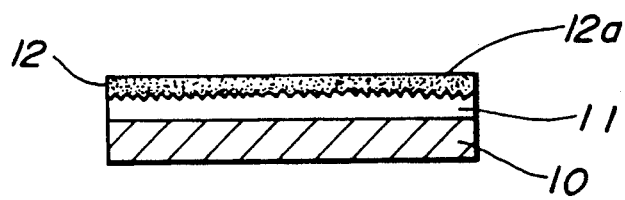

In a step of FIG. 1(B), an organic photoresist 12 such as the Novolac resin is deposited on the surface of the SiC membrane layer 11 for a thickness of 0.5 $\mu$m by spin coating. The photoresist 12 thus deposited covers the SiC membrane layer 11 with low viscosity and forms a mirror-flat top surface 12a.

Figure 1C:
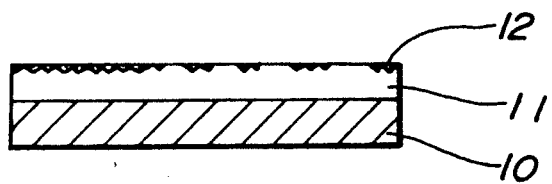
Figure 1D:
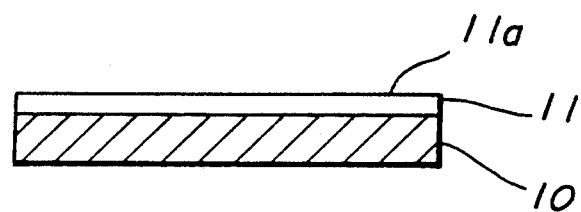

Next, the photoresist 12 is removed by dry etching together with a part of the SiC membrane layer 11 by using a mixture of chlorine (Cl$_2$) and carbon tetrachloride (CCl$_4$) while maintaining a mirror-flat top surface as shown in FIG. 1(C). The condition of the dry etching is set such that the etching rate for the photoresist 12 and the etching rate for the SiC membrane layer 11 are identical to each other. FIG. 1(C) shows a state that a part of the SiC membrane layer 11 is etched away together with the photoresist 12. As a result, a structure shown in FIG. 1(D) is obtained in which the photoresist 12 is entirely removed and a top surface 11a is exposed. As the etching has proceeded while maintaining the mirror-flat top surface, this top surface 11a also forms a mirror-flat top surface with a surface roughness less than about 0.02 $\mu$m.

Figure 1E:
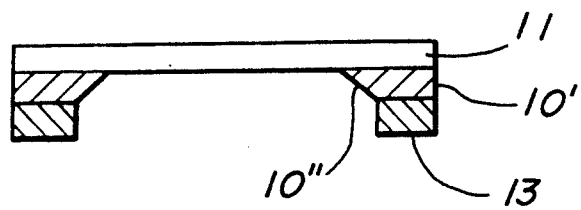
Figure 1F:
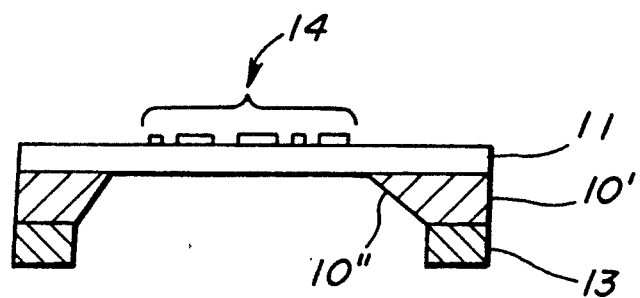

Next, a ring 13 of a heat resistant silicate glass such as Pyrex (trade name) or a ceramic material is attached to the rear side of the substrate 10 by an epoxy adhesive and the like and the substrate is subjected to etching from the rear side until the rear side of the SiC membrane layer 11 is exposed through a Si substrate 10' which now has an exposure opening 10". As a result, a structure shown in FIG. 1(E) is obtained. Note that the SiC membrane layer 11 maintains the mirror-flat top surface.

On this mirror-flat top surface of the structure of FIG. 1(E), a Ta layer is deposited by sputtering for a thickness of about 0.8–1.2 $\mu$m and is patterned for example by using the electron beam lithography process according to a desired semiconductor pattern as shown in the drawing by a numeral 14. As the Ta layer forming the pattern 14 is provided on the mirror-flat top surface, the semiconductor pattern thus formed has a high precision. More specifically, the line width of about 0.2 $\mu$m, which is substantially smaller than 0.5 $\mu$m, is achieved with reliability. According to the experiments conducted by the applicants, a similar result was obtained also when tungsten (W) is used instead of Ta.

Next, a second embodiment of the present invention will be described with reference to FIG. 1(A) and FIGS. 1(D)-(F).

In this embodiment, the structure shown in FIG. 1(A) is obtained similarly to the case of the first embodiment. This structure is then subjected to a mechanical surface lapping wherein the surface of the SiC membrane layer 11 is mirror finished by a well established polishing process, and the structure shown in FIG. 1(D) is obtained directly from the structure of FIG. 1(A). Thereafter, the steps of FIGS. 1(E) and (F) are carried out as already described with reference to the first embodiment and the structure substantially identical to that of the first embodiment is obtained. According to this procedure, a high precision X-ray exposure mask is obtained by a very simple and well established process.

Next, a third embodiment of the present invention will be described with reference to FIGS. 2(A) through (D).

Figure 2A:
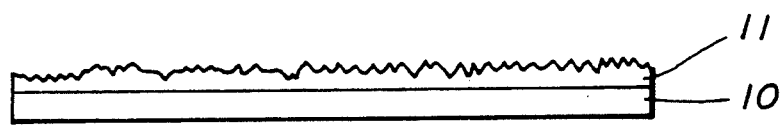
FIGS. 2(A)-(D) are diagrams showing a manufacturing process of the X-ray exposure mask according to another embodiment of the present invention.

In a step of FIG. 2(A), the SiC membrane layer 11 is grown on the (111) surface of the Si substrate 10. The growth is made in a cold wall CVD apparatus at a temperature of about 1000° C. under a pressure of about 200–400 Pa with the source gas comprising a mixture of SiHCl$_3$/C$_3$H$_8$/H$_2$ for a thickness of about 2 $\mu$m.

Next, the structure of FIG. 2(A) is brought into a cathode coupled type plasma CVD/etching apparatus and carbon is deposited on the SiC membrane layer 11 by introducing methane (CH$_4$) diluted by argon (Ar) to 10 concentration level while applying a radio frequency power of 0.3 W/cm$^2$ at a temperature of 100° C. and a pressure of 0.15 Torr. As a result, a layer of amorphous carbon 21 is formed on the SiC membrane layer 11 for a thickness of about 0.2 $\mu$m with an excellent mirror-flat top surface of which surface roughness is substantially below the detection limit. This mirror-flat top surface is obtained as a result of etching of the SiC membrane layer 11 proceeding simultaneously to the deposition of carbon. The etching is caused by collision of Ar ion and acts selectively on the projected part of the SiC membrane layer 11. Thereby, the surface 11b of the SiC membrane layer 11 becomes mirror-flat as shown in FIG. 2(B) and the amorphous carbon layer 21 is grown on this mirror flat surface of the SiC membrane layer 11.

Figure 2B:
Figure 2C:
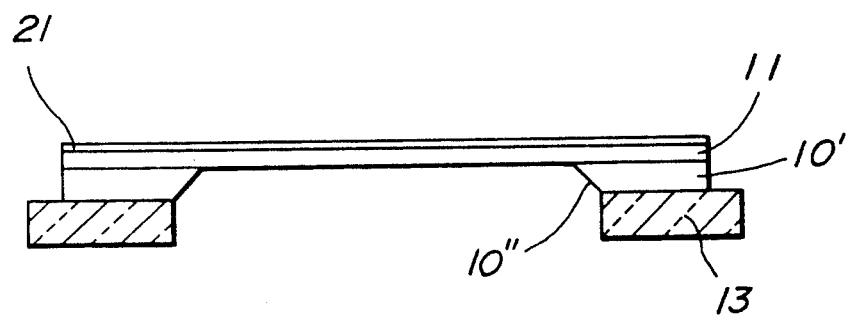
Figure 2D:
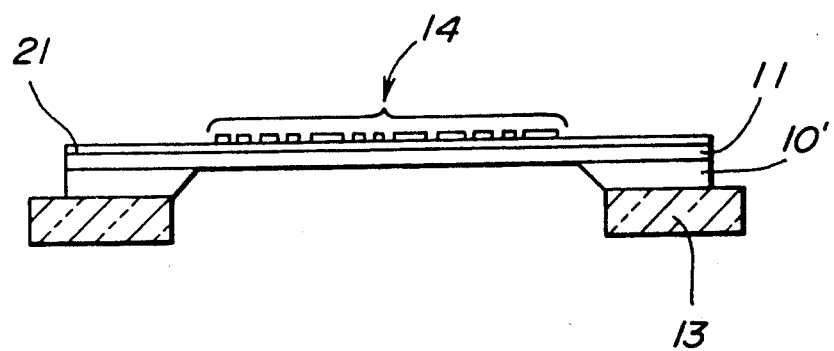

After the step of FIG. 2(B), the structure is attached with the ring 13 and the Si substrate 10 is etched from the rear side as shown in FIG. 2(C) and the Ta pattern 14 is provided on the amorphous carbon layer as shown in FIG. 2(D). These steps are identical to those already described with reference to FIGS. 1(E) and (F) and therefore further description thereof will be omitted.

Alternatively, the growth of the amorphous carbon layer 21 on the SiC membrane layer 11 may be performed by using an ECR-CVD apparatus. In this case, the Si substrate 10 covered by the SiC membrane layer 11 is incorporated into the ECR-CVD apparatus and the amorphous carbon layer 21 is grown at a temperature of 100° C. and a pressure of $5 \times 10^{-4}$ Torr while flowing the $CH_4$ gas diluted by Ar to 10% level under a substrate bias voltage exceeding 100 volts for a duration of 2-3 minutes. In this method, too, a result identical to that of the third embodiment is achieved.

The amorphous carbon layer 21 thus grown either by the plasma CVD or ECR-CVD method has a refractive index of 2.6 and the fundamental optical absorption edge at 1.8 eV. Thus, the amorphous carbon layer is free from optical problems or problems related to the endurance to the radiation. Further, the amorphous carbon layer is stable against the mixture of hydrofluoric acid and nitric acid ($HF/HNO_3$) or to potassium hydroxide (KOH). Thus, the membrane can be used without problem in the actual exposure process or in other processes of manufacturing the mask.

Next, a fourth embodiment of the present invention will be described.

In this embodiment, the Si substrate 10 exposing the (111) surface is placed in the cold wall CVD apparatus and the SiC membrane layer 11 is grown on the (111) surface for a thickness of about 2 μm at a temperature of 850-1000° C. and a pressure of 2 Torr while flowing the source gas of $SiHCl_3/C_3H_8/H_2$ for 80 minutes. As a result, a structure similar to those shown in FIGS. 1(A) and 2(A) is obtained.

Next, this structure is placed in a sputter etching apparatus and the surface of the SiC membrane 11 is subjected to the sputter etching process using the Ar gas with a pressure of 0.1 Torr as the sputtering gas while establishing electrical discharge with an electrical power of 200 watts for ten minutes. As a result of this process, the surface of the SiC membrane layer 11 becomes mirror flat similarly to the surface 11a.

After this process, the ring 13 is attached to the rear side of the Si substrate 10 and the substrate is subjected to a wet etching process which may be performed by a solution of $HF/HNO_3/CH_3COOH$ such that the etching proceeds from the rear side of the substrate 10. As a result, a structure similar to the one shown in FIG. 1(E) is obtained, and the Ta patterning similar to that shown in FIG. 1(F) by the numeral 14 is provided on the membrane layer 11.

Figure 3:
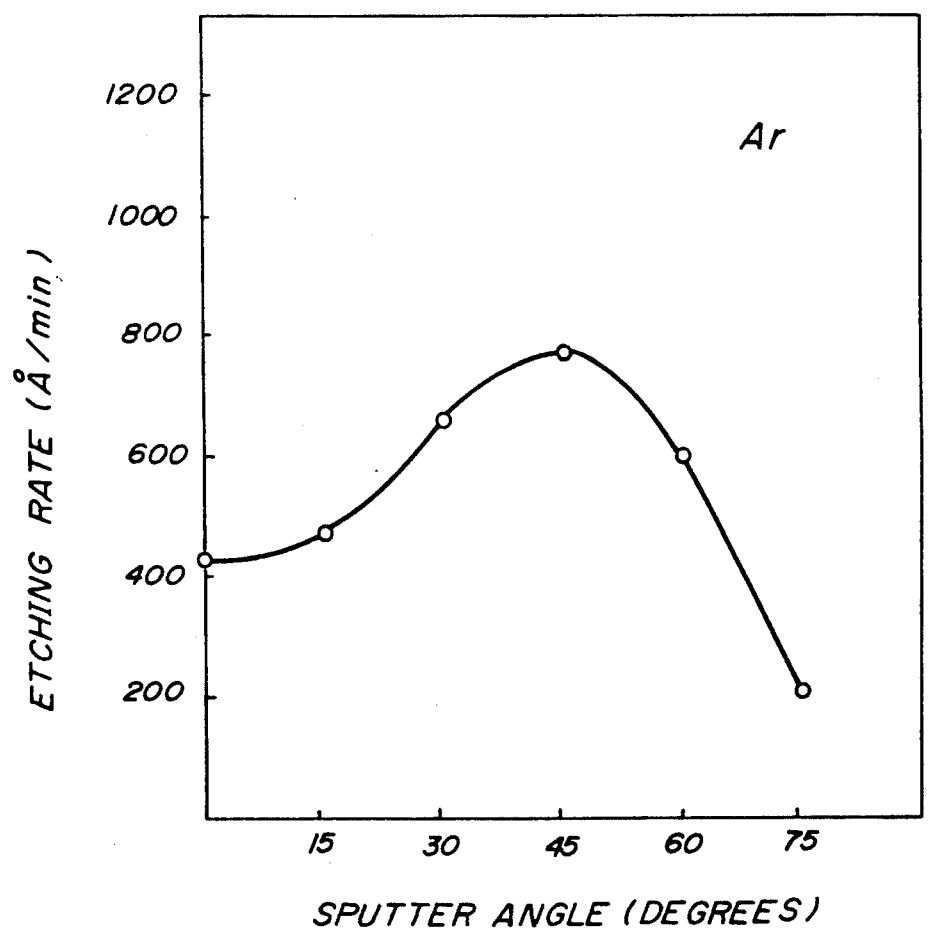
FIG. 3 is a diagram showing an angular dependence of the sputter etching rate of which property is employed in an embodiment of the present invention.

FIG. 3 shows the angular dependence of sputter etching which forms the basis of this embodiment. As can be seen in FIG. 3, the rate of etching becomes maximum at the sputtering angle of about 45 degrees. This means that a pyramid-like projection having inclined surfaces inclined with an angle of about 45 degrees is subjected to the most active sputter etching and thus, the surface projections are rapidly eliminated.

Next, a fifth embodiment of the present invention will be described.

Figure 4A:
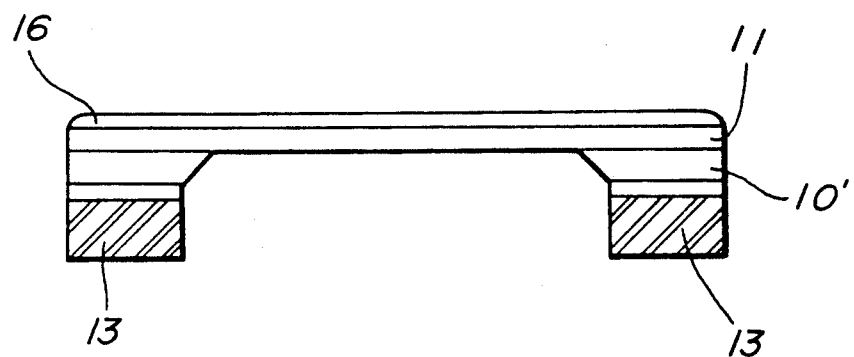
FIGS. 4(A) and (B) are diagrams showing a manufacturing process of the X-ray exposure mask according to other embodiment of the present invention.

In this embodiment, a structure similar to the one shown in FIG. 1(A) or FIG. 2(A) is covered by a glass layer 16 as shown in FIG. 4(A). This layer 16 may be a PSG layer containing phosphorus (P) by an amount of 8 percent by weight and is grown for a thickness of about 0.5 μm by a CVD process. Alternatively, the layer 16 may be a BPSG (borophosphosilicate glass) containing boron (B) and P respectively with 4 percent by weight and 5 percent by weight. The glass layer 16 is then heat treated in a nitrogen atmosphere at a temperature of 900-1050° C., whereby the layer 16 is molten and spread over the SiC membrane layer 11 with an excellent mirror-flat surface. The irregularity exceeding about 0.1 μm is thereby completely eliminated.

Figure 4B:
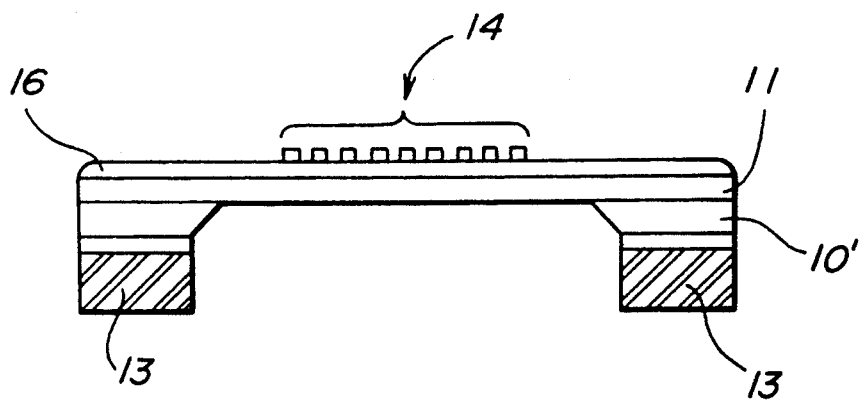

After this step, the ring 13 is attached to the substrate 10 and the substrate 10 is etched from the rear side by using the etching solution of $HF/HNO_3/CH_3COOH$ until the rear side of the SiC membrane layer 11 is exposed and a structure shown in FIG. 4(A) is obtained. During this step, the surface of the glass layer 16 is protected by a carbon layer (not shown) which is later removed by oxidation. Further, the pattern 15 is provided on the glass layer 16 as already described by depositing Ta and performing the electron beam lithography. Thus, a structure shown in FIG. 4(B) is obtained. During the patterning process, a resist such as PMMA (polymethylmethacrylate) commonly used in the electron beam lithography may be used. Further, the etching to form the pattern 15 may be the RIE process using the mixture of $Cl_2/CCl_4$ as the etching gas.

Alternatively, the glass layer 16 may be etched starting from its top surface together with a part of the underlying SiC membrane layer 11 similarly to the embodiment of FIGS. 2(A) and (B). In this case, the etching is performed by an RIE process using a mixture of carbon tetrafluoride ($CF_4$) and oxygen ($O_2$) as the etching gas. When the layer 16 is removed, a completely flat mirror surface is left for the SiC membrane layer 11.

Next, a sixth embodiment of the present invention will be described.

Figure 5A:
FIGS. 5(A)-(F) are diagrams showing a manufacturing process of the X-ray exposure mask according to still other embodiment of the present invention.
Figure 5B:
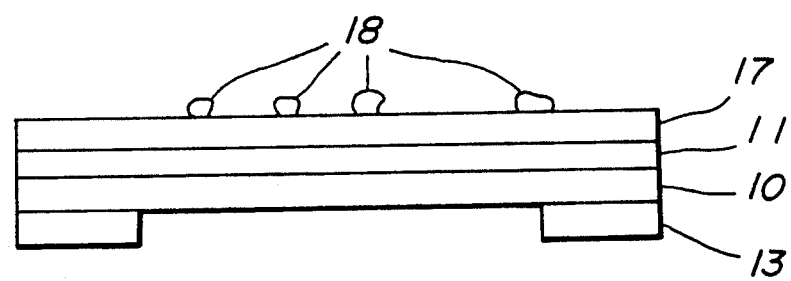
Figure 5C:
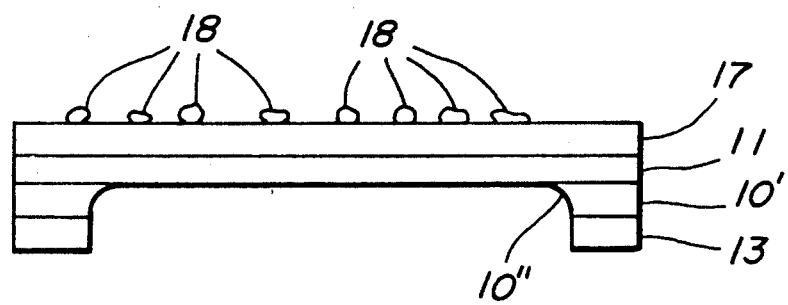

In this embodiment, a structure as shown in FIG. 1(D), in which the SiC membrane layer 11 grown on the Si substrate 10 is processed to have a completely flat top surface, is covered further by a phosphosilicate glass (PSG) layer 17 deposited by a CVD process for a thickness of about 500 Å-2 μm. This layer 17 may also be a silica glass spin coated on the SiC membrane layer 11. Further, baking of the glass layer 17 may be performed as needed. Next, the ring 13 is attached to the bottom of the Si substrate 10 as shown in FIG. 5(B) and the structure of FIG. 5(B) is subjected to the wet etching which acts upon the rear side of the substrate 10. As a result, a structure shown in FIG. 5(C) is obtained.

Figure 5D:
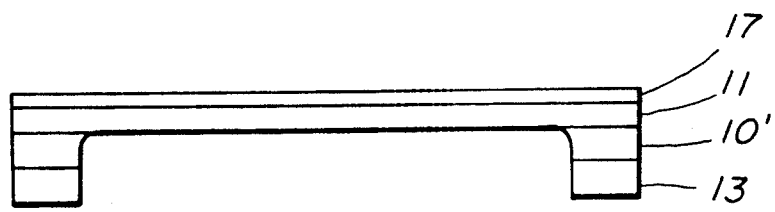

As the steps of FIGS. 5(B) and (C) are performed outside of the clean environment, there is a substantial chance that dusts or other contaminants 18 are deposited on the surface of the glass layer 17. In the present embodiment, these dusts 18 are removed entirely when the glass layer 17 is etched in a step of FIG. 5(D) which is performed after the ring 13 is attached and after the exposure opening 10'' is formed. The etching in this step may be performed by an RIE process.

Figure 5E:
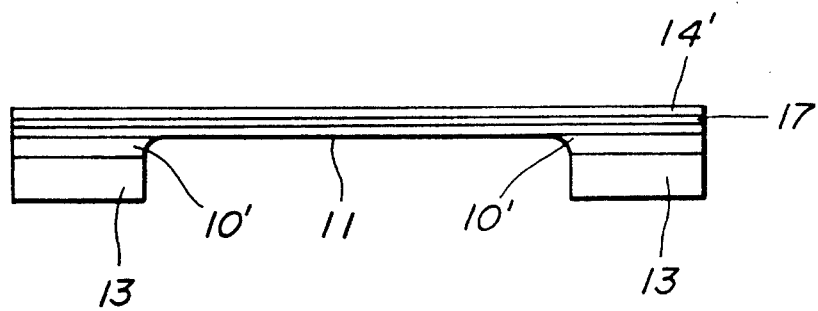
Figure 5F:
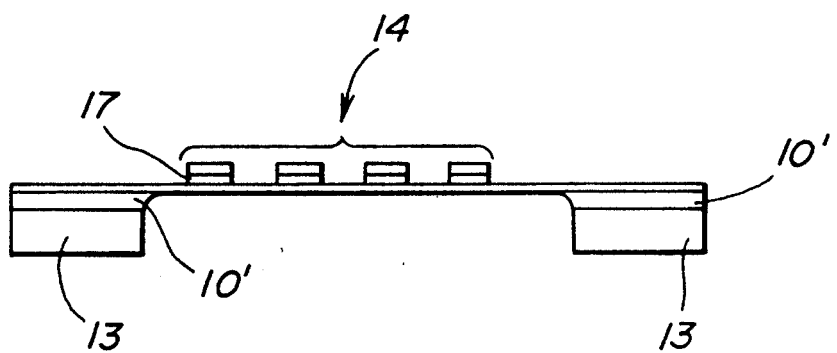

Next, a layer 14' of Ta is deposited on the remaining glass layer 17 for a thickness of about 1 μm as shown in FIG. 5(E) and the layer 14' is patterned by the electron beam lithography. As a result, the pattern 14 is formed. Note that the glass layer 17 remains under the pattern 14. Thus, the remaining glass layer 17 is patterned using the pattern 14 as the mask and a structure shown in FIG. 5(F) is obtained.

As already noted, the present embodiment enables the complete removal of dusts or any other contaminants from the surface of membrane prior to the deposition of the pattern. Thus, the precision of the pattern is improved. When the SOG (spin-on-glass) process is used for the glass layer 17, a mirror-flat surface for the layer 17 is also achieved except, of course, for the dusts.

Further, the present invention is not limited to these embodiments described heretofore but various variations and modifications may be made without departing from the scope of the invention.

What is claimed is:

1. A method of manufacturing an X-ray exposure mask comprising the steps of:
    forming a membrane comprising a layer of silicon carbide on a silicon substrate;
    processing a top surface of the membrane such that the top surface becomes a mirror-flat top surface;
    depositing a layer of an X-ray absorbing material on the mirror-flat top surface of the membrane; and
    patterning the layer of the X-ray absorbing material according to a desired semiconductor pattern,
    said step of processing comprising the steps of growing an organic material layer on said silicon carbide membrane such that the organic material layer has a mirror-flat top surface, and etching the organic material layer starting from the mirror-flat top surface until the silicon carbide layer underneath the organic material layer is exposed.

2. A method as claimed in claim 1 in which said step of etching is performed such that the etching proceeds uniformly with an identical etching rate in the organic material layer and in the silicon carbide layer such that the exposed silicon carbide layer has a mirror-flat top surface.

3. A method of manufacturing an x-ray exposure mask comprising the steps of:
    forming a membrane comprising a layer of silicon carbide on a silicon substrate;
    processing a top surface of the membrane such that the to surface becomes a mirror-flat top surface;
    depositing a layer of an X-ray absorbing material on the mirror-flat top surface of the membrane; and
    patterning the layer of the X-ray absorbing material according to a desired semiconductor pattern,
    said step of processing the top surface of the membrane comprising a step of polishing a top surface of the silicon carbide layer such that the top surface of the silicon carbide layer becomes a mirror-flat surface.

4. A method of manufacturing an X-ray exposure mask comprising the steps of:
    forming a membrane comprising a layer of silicon carbide on a silicon substrate;
    processing a top surface of the membrane such that the top surface becomes a mirror-flat top surface;
    depositing a layer of an X-ray absorbing material on the mirror-flat top surface of the membrane; and
    patterning the layer of the X-ray absorbing material according to a desired semiconductor pattern,
    said step of forming the membrane comprising a step of growing an amorphous carbon layer on said silicon carbide layer by a plasma chemical vapor deposition process using a mixture of hydrocarbon and an inert gas, and said step of processing comprises a step of etching the amorphous carbon layer simultaneously to the growth of the amorphous carbon layer.

5. A method of manufacturing an X-ray exposure mask comprising the steps of:
    forming a membrane comprising a layer of silicon carbide on a silicon substrate;
    processing a top surface of the membrane such that the top surface becomes a mirror-flat top surface;
    depositing a layer of an X-ray absorbing material on the mirror-flat top surface of the membrane; and
    patterning the layer of the X-ray absorbing material according to a desired semiconductor pattern,
    said step of processing comprising a step of etching a top surface of the silicon carbide layer by sputter etching such that the top surface of the silicon carbide layer becomes a mirror-flat surface.

6. A method of manufacturing an X-ray exposure mask comprising the steps of:
    forming a membrane comprising a layer of silicon carbide on a silicon substrate;
    processing a top surface of the membrane such that the top surface becomes a mirror-flat top surface;
    depositing a layer of an X-ray absorbing material on the mirror-flat top surface of the membrane; and
    patterning the layer of the X-ray absorbing material according to a desired semiconductor pattern,
    said step of forming the membrane comprising a step of providing a layer of a low-melting point glass on said silicon carbide layer, and said step of processing comprises a step of reflowing the glass layer such that the glass layer has a mirror-flat surface.

7. A method as claimed in claim 6 in which said step of processing further comprising a step of etching the glass layer starting from its top surface until the silicon carbide layer underneath is exposed, said etching proceeds uniformly such that the etching rate is identical in the etching of the glass layer and in the etching of the silicon carbide layer.

8. A method of manufacturing an X-ray exposure mask comprising the steps of:
    forming a membrane comprising a layer of silicon carbide on a silicon substrate;
    processing a top surface of the membrane such that the top surface becomes a mirror-flat top surface;
    depositing a layer of an X-ray absorbing material on the mirror-flat top surface of the membrane; and
    patterning the layer of the X-ray absorbing material according to a desired semiconductor pattern,
    said step of forming the membrane comprising the steps of providing a glass layer on the silicon carbide layer and subsequently providing a supporting body of the membrane on a rear side of the silicon substrate, and said step of processing comprises etching the glass layer, after the step of providing the supporting body, starting from its top surface, so that dusts deposited on the glass layer during the step of providing the supporting body are removed together with a part of the glass layer, said etching being performed such that the exposed top surface of the glass layer becomes a mirror-flat surface.

* * * * *

UNITED STATES PATENT AND TRADEMARK OFFICE
CERTIFICATE OF CORRECTION

PATENT NO.  : 5,178,977
DATED       : January 12, 1993
INVENTOR(S) : Yamada et al.

It is certified that error appears in the above-identified patent and that said Letters Patent is hereby corrected as shown below:

Column 4, line 56, "10" s/b --10%--.

Column 7, line 43, "to" s/b --top--.

Signed and Sealed this

Thirtieth Day of November, 1993

Attest:

BRUCE LEHMAN

Attesting Officer

Commissioner of Patents and Trademarks